United States Patent [19]

McEachern et al.

[11] Patent Number: 4,694,402

[45] Date of Patent: Sep. 15, 1987

[54] WAVEFORM DISTURBANCE DETECTION APPARATUS AND METHOD

[75] Inventors: Alexander McEachern, Oakland; Frederic Nitz, Boulder Creek, both of Calif.

[73] Assignee: Basic Measuring Instruments, Foster City, Calif.

[21] Appl. No.: 738,566

[22] Filed: May 28, 1985

[51] Int. Cl.$^4$ .................. G01R 19/65; G01R 29/04
[52] U.S. Cl. ........................... 364/487; 361/86; 364/481; 324/102
[58] Field of Search ............... 364/481, 483, 487; 361/86, 87, 96, 93, 91; 324/77 R, 102

[56] References Cited

U.S. PATENT DOCUMENTS

| | | | |
|---|---|---|---|
| 3,278,685 | 10/1966 | Harper | 179/1 |
| 3,532,905 | 10/1970 | Zijta et al. | 307/265 |
| 3,753,133 | 8/1973 | Shumate, Jr. | 328/132 |
| 3,758,763 | 9/1973 | Nohara et al. | 364/487 |
| 3,927,309 | 12/1975 | Fujiwara et al. | 364/487 |
| 3,958,132 | 5/1976 | Livesay | 328/132 |
| 4,064,488 | 12/1977 | Chapman | 364/487 |
| 4,132,947 | 1/1979 | Weischedel et al. | 328/114 |
| 4,160,175 | 7/1979 | Trout | 328/135 |
| 4,219,860 | 8/1980 | DePuy | 361/96 |
| 4,342,965 | 8/1982 | Baldwin | 328/114 |
| 4,446,498 | 5/1984 | Stich | 361/96 |
| 4,510,571 | 4/1985 | Dagostino et al. | 364/487 |

*Primary Examiner*—Errol A. Krass
*Assistant Examiner*—Daniel W. Juffernbruch
*Attorney, Agent, or Firm*—Limbach, Limbach & Sutton

[57] ABSTRACT

A waveform disturbance detection apparatus for detecting disturbances in alternating current electromagnetic energy waveform, the alternating current electromagnetic energy waveform having a plurality of periodic, substantially similar cycles. The detection apparatus comprises converter means for sampling the electromagnetic energy waveform, generating a plurality of samples, and converting the samples into digital signals. The detection apparatus also comprises processing means for evaluating the digital signals so as to detect disturbances in the electromagnetic energy waveform, wherein the processing means detects the disturbances by comparing a particular one of the digital signals that represents a particular one of the samples in a particular one of the cycles with a corresponding one of the digital signals that represents a corresponding one of the samples from the remaining cycles.

49 Claims, 6 Drawing Figures

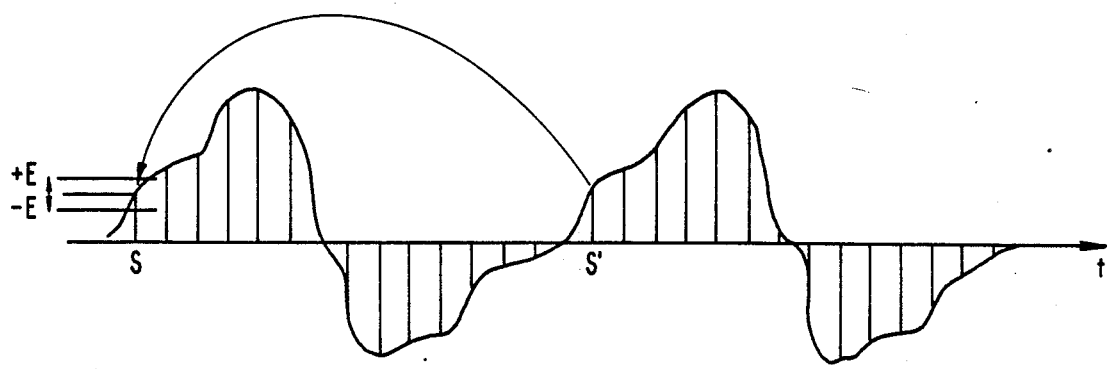
FIG._1.
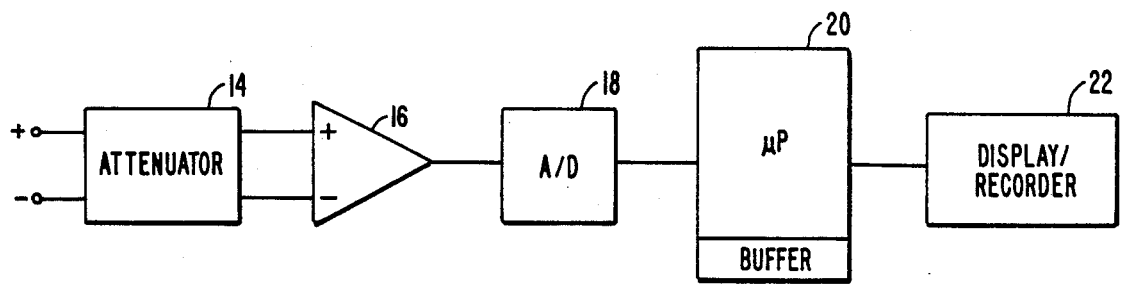
FIG._2.
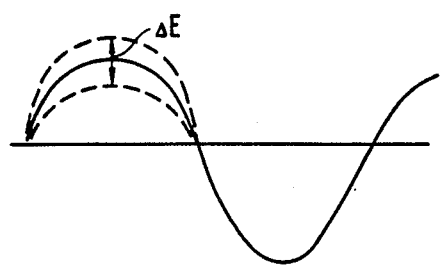
FIG._3A.
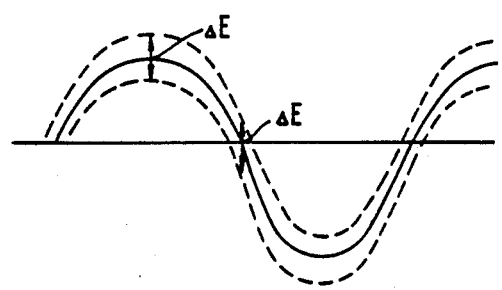
FIG._3B.

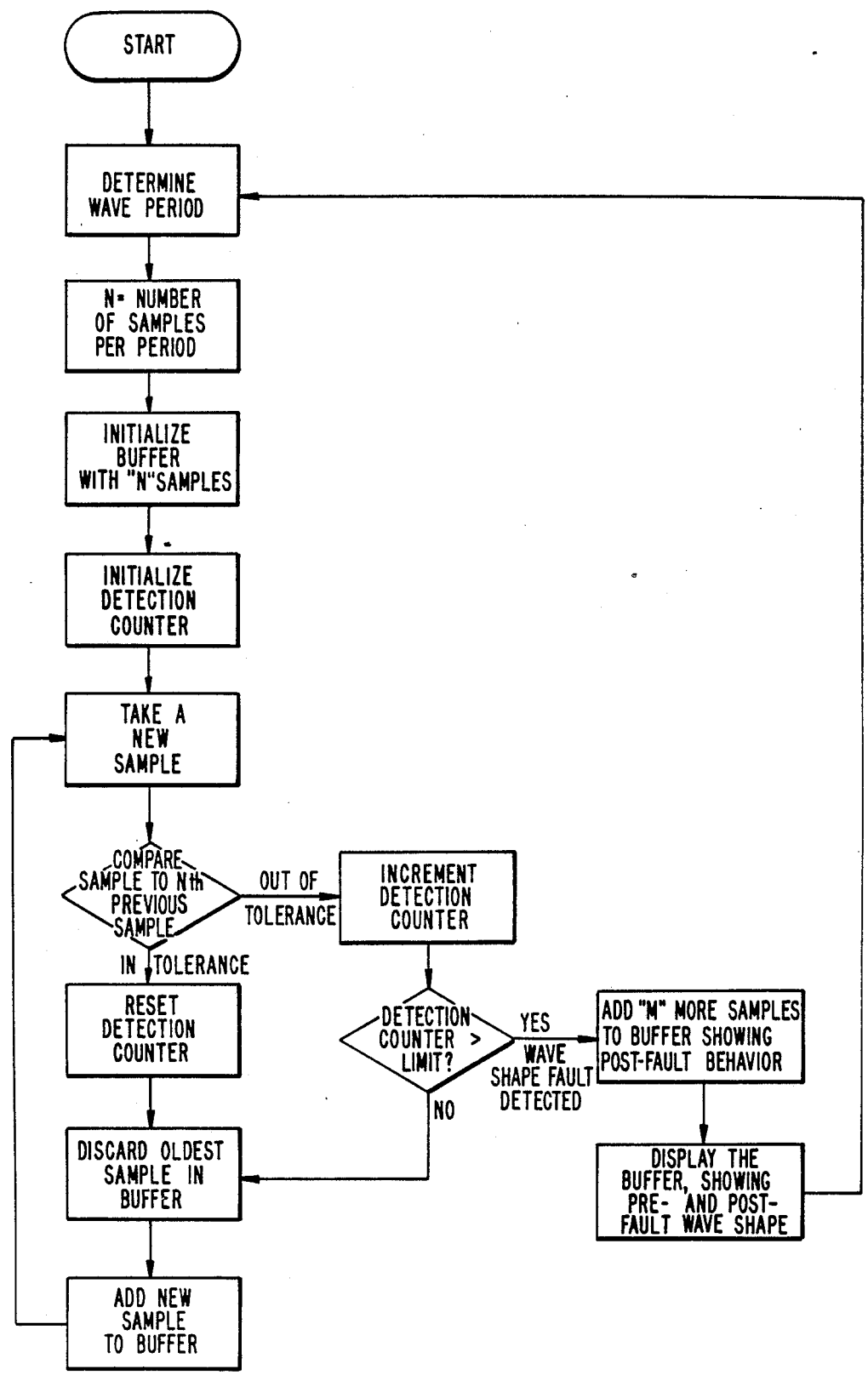
FIG._4A.

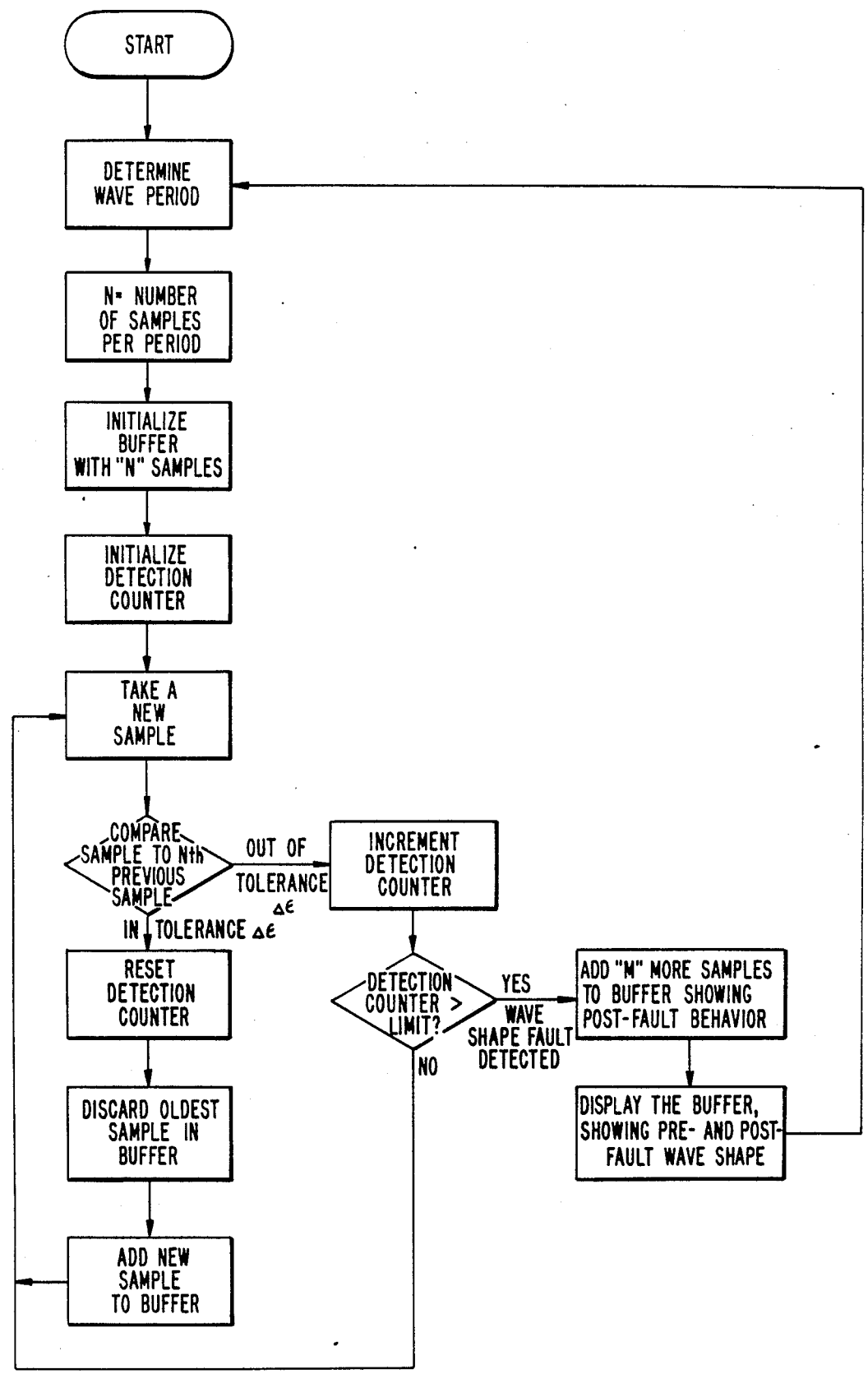
FIG._4B.

WAVEFORM DISTURBANCE DETECTION APPARATUS AND METHOD

DESCRIPTION

1. Technical Field

This invention relates to electrical detection apparatus, and more particularly, to a waveform disturbance detection apparatus and method.

2. Background Art

Detectors which are capable of detecting disturbances on alternating current (AC) power lines are common in the art. These power disturbances include voltage errors, sudden drops or impulses, frequency errors, and common-mode and normal-mode noise. Detecting, and especially identifying, the causes of such power disturbances is critical when the AC power is being used to operate computers or microprocessor-based equipment. The ability to detect such power disturbances permits the user to identify and isolate problem areas such as defective components, defective cables, or defective software. Examples of prior art detectors include Shumate, Jr., U.S. Pat. No. 3,753,133 and Weischedel et al., U.S. Pat. No. 4,132,947.

In general, prior art detectors generally function in a manner such that the waveform of the AC power line to be analyzed is compared with a desired waveform, generally referred to as a template. If the analyzed waveform is at variance with the template, the presence of that variance is then categorized as a disturbance. Such a method generally produces an inordinate amount or false alarms since any variance, however minute, is categorized as a disturbance. For example, the waveshape of a waveform invariably changes slowly as time passes. In addition, since there are a multitude of waveshapes which may be used, e.g., sine waves, sawtooth waves, etc., a different template must be used in order to detect the disturbances of a particular type of waveshape.

DISCLOSURE OF THE INVENTION

In view of the prior art, it is a major object of the present invention to provide a waveform disturbance detection apparatus and method that minimizes the number of false alarms.

It is another object of the present invention to provide a waveform disturbance detection apparatus and method that is capable of detecting disturbances without taking into account the type of waveshape that is being analyzed.

In order to accomplish the above and still further objects, the present invention provides a waveform disturbance detection apparatus for detecting disturbances in alternating current electromagnetic energy waveform, the alternating current electromagnetic energy waveform having a plurality of periodic, substantially similar cycles. The detection apparatus comprises converter means for sampling the electromagnetic energy waveform, generating a plurality of samples, and converting the samples into digital signals. The detection apparatus also comprises processing means for evaluating the digital signals so as to detect disturbances in the electromagnetic energy waveform, wherein the processing means detects the disturbances by comparing a particular one of the digital signals that represents a particular one of the samples in a particular one of the cycles with a corresponding one of the digital signals that represents a corresponding one of the samples from the remaining cycles.

Other objects, features, and advantages of the present invention will appear from the following detailed description of the best mode of a preferred embodiment, taken together with the accompanying drawings.

BRIEF DESCRIPTION OF THE DRAWINGS

FIG. 1 is a graphical illustration of the operation of a waveform disturbance detection apparatus and method of the present invention;

FIG. 2 is a simplified block diagram of the waveform disturbance detection apparatus of FIG. 1;

FIGS. 3A and 3B illustrate the use of the tolerance range for the waveform disturbance detection apparatus of FIG. 2; and FIGS. 4A and 4B are flow diagrams of the operation of the waveform disturbance detection apparatus and method of FIG. 2.

BEST MODE FOR CARRYING OUT THE INVENTION

Referring to FIG. 1, there is shown an alternating current (AC) waveform. The AC waveform, by definition, is a plurality of periodic, substantially similar cycles. In the preferred embodiment, the waveform is first sampled at a rate that provides a user-specified number of samples per waveform cycle or period, each sample being separated in time by the same time interval. A sample from a current cycle or period of the waveform is then compared with a corresponding sample from a different cycle or period of the waveform. For example, the sample of the waveform that is designated S is compared with a corresponding sample that is designated S'. Sample S of the current cycle occurs at a point in its period that corresponds to the position of sample S' in relation to its period. Moreover, sample S' in the preferred embodiment is taken from a cycle that precedes the current cycle that contains sample S. Whereas prior art detectors compare the entire waveshape of the waveform that is currently being analyzed with a template that reflects a desired waveshape, the apparatus and method of the present invention compare the waveform at a particular point in a cycle with a corresponding point in a preceding cycle of the same waveform. More specifically, the present invention compares the amplitude of sample S with the amplitude of corresponding sample S'.

To minimize false alarms, the present invention provides a range or window about the amplitude of the preceding sample within which the current sample is permitted to vary without generating a faulty condition or disturbance. This window or tolerance is designated as a range from $+\epsilon$ to $-\epsilon$, or $\Delta\epsilon$. If the amplitude of sample S' is within the tolerance range of the amplitude of sample S, such a difference is not categorized as a power disturbance. Thus, the presence of minor variances does not create false alarms.

In addition, as contrasted to the use of templates in the prior art, the present invention need not take into account the waveshape of the AC power since it employs a comparison of the amplitudes within the same waveform. A multitude of templates is, therefore, not required in the instant invention even though a wide variety of waveshapes may be evaluated.

The preferred embodiment of the present invention is best illustrated in FIG. 2. A waveform disturbance detection apparatus, generally designated 12, is provided. Apparatus 12 comprises an attenuator 14, a differential amplifier 16, an analog-to-digital (A/D) converter 18, and processing means 20. More particularly, attenuator 14 is connected to the AC power lines, or other lines which are being monitored, in a conventional manner. Attenuator 14, having an input resistance of approximately 10 megaohms, is capable of providing an attenuation of approximately 1000 to 1. This resistance provides isolation of apparatus 12 from the lines being monitored, prevents undue loading of the lines by apparatus 12, and provides a signal amplitude that is compatible with the downstream processing circuitry. It is within the knowledge of those skilled in the art that other attenuation ratios should be used where appropriate; for example, when the amplitude of the waveform is in the 1200-volt range, an attenuation ratio of 10,000 to 1 could be used. The outputs of attenuator 14 are inputted into differential amplifier 16.

Differential amplifier 16 is used in order to permit the monitoring of disturbances on either of the two AC power lines. The output of differential amplifier 16 is then converted to digital data by A/D converter 18. A/D converter 18 in the preferred embodiment is a high-speed A/D converter such as the 12-bit, Type ADC10A0 A/D converter manufactured by National Semiconductor Corp. of Santa Clara, Calif. A/D converter 18 has a conversion speed of approximately 22 microseconds. The digital output of A/D converter 18, representing samples of the waveform, is then received by processing means 20.

Processing means 20, a microprocessor in the preferred embodiment, primarily compares the amplitude of the just-received sample, such as sample S, with that of a prior, stored sample, such as sample S'. In addition, microprocessor 20 is capable of storing the user-selected tolerance range. The range of $\Delta\epsilon$, for example, may be selected by the user to be a value from one to 20 percent of the amplitude of the sample that is being analyzed, as best shown in FIG. 3A. In such an instance, the value of the range or window varies as a proportion of the amplitude of the waveform. In the alternative, the value of the range or window may be selected to be an absolute value, as best shown in FIG. 3B. Further, microprocessor 20 is capable of storing, in a conventional buffer, samples corresponding to an entire cycle of the waveform. The stored data, generally correspond to 64 samples of a cycle, are the "prior" waveform data with which the samples of the just-received cycle are compared. Microprocessor 20 also includes a disturbance detection counter that stores the number of successive samples which are outside the tolerance range.

In an alternative embodiment of the present invention, microprocessor 20 is configured to store samples of the waveform corresponding to several cycles of the waveform that come after the samples in which the disturbances occurred. These post-fault waveforms, which are stored in a post-disturbance buffer of microprocessor 20, are then used in the waveform disturbance analyses. Microprocessor 20 in the preferred embodiment is a Type Z-80 microprocessor manufactured by Zilog Corp. of Santa Clara, Calif.

Last, a conventional recorder/display 22 is provided to graphically illustrate the waveform of the AC power line that is being analyzed.

In operation, as best illustrated in FIG. 4A, microprocessor 20 first determines and then initializes itself with the period of the waveform to be analyzed, e.g., 60 Hz. The user selects an arbitrary number for the number of samples that will be taken for each cycle of the waveform. This arbitary number, designated "N", is selected to be 64 in the preferred embodiment. These samples form the basis for the comparison. Microprocessor 20 then obtains and stores N samples of a cycle of the waveform in an internal buffer. The user also selects the tolerance range $\Delta\epsilon$. Microprocessor 20 also maintains the disturbance detection counter, which is also initialized at this time.

As each sample in a cycle is obtained, e.g., sample S of the waveform of FIG. 1, its amplitude is compared with the amplitude of the corresponding sample in the preceding cycle, e.g., sample S'. As can be seen in FIG. 1, the samples S' can come from the cycle immediately preceding the cycle from which the samples S are obtained. If the amplitude of the waveform at sample S is within the tolerance range, the disturbance detection counter is re-initialized to zero. The oldest of the N samples in the buffer is discarded and the just-analyzed sample is stored in its place. Thereafter, a new sample is taken and analyzed. In other words, for samples of a different cycle, the samples S' against which they are compared will be different than the samples S' against which the samples S of the current cycle are compared. More specifically, as can be seen from FIG. 4A, the samples S' come from a reference cycle which changes for each different cycle being examined.

If, however, the difference between the analyzed sample and prior corresponding sample exceeds the tolerance, the disturbance detection counter is incremented. If the number of consecutive faults or disturbances for each cycle has not reached a predetermined amount designated by the user, additional samples are taken and analyzed, as best shown in FIG. 4A.

In an alternative to the above step of discarding the oldest sample in the buffer and storing the present sample, the faulty, just-received sample is discarded, as best shown in FIG. 4B. Instead of discarding the oldest sample in the buffer, which in essence is the sample of the preceding period that had just been used in the comparison, the faulty, just-received sample is discarded. This procedure ensures that the future comparison utilizes a "normal" sample, and not the faulty, just-received sample, as the basis of the comparison.

If the number of consecutive faults or disturbances in the just-analyzed cycle is greater than the preselected limit, the operational sequence proceeds to store an arbitrary number, designated as "M", of post-fault samples into the post-disturbance buffer. These post-fault samples permit a better analysis of the disturbance pattern. Last, waveforms which include both the disturbances and the post-fault samples may be displayed via recorder/display 22. The operation then returns to the beginning of the sequence, awaiting a new waveform cycle.

In summary, it is to be understood that in the preferred embodiment of the present invention a plurality of points in each cycle of the waveform are compared against the corresponding number of prior samples maintained by microprocessor 20. As each point in the current cycle is sampled, it is compared against a corresponding one of the stored prior samples. These prior samples are all from the preceding cycle.

The alternative embodiment, however, compares the plurality of points in each cycle of the waveform with the corresponding number of "normal" samples maintained by microprocessor 20. As each point in the current cycle is sampled, it is compared against a corresponding one of the stored "normal" samples. These "normal" samples may or may not all be from the preceding cycle. They are merely the most recent "normal" samples. In this fashion, each and every point of the current cycle is compared with the corresponding one of the stored "normal" samples.

It will be apparent to those skilled in the art that various modifications may be made within the spirit of the invention and the scope of the appended claims. Since the fundamental concept of the present invention is the detection of changes in the shape of any repetitive waveform, the present invention is useful in applications where the detection of a change between one cycle and the next is important. Examples of such applications include electrocardiography (EKG), mechanical vibration machinery, process control oscillations, etc.

What is claimed is:

1. A waveform disturbance detection apparatus for detecting disturbances in an alternating current electromagnetic energy waveform, said alternating current electromagnetic energy waveform having a plurality of periodic, normally similar cycles, comprising
    converter means for obtaining a plurality of samples from consecutive cycles of said electromagnetic energy waveform; and
    processing means for comparing samples from a selected cycle of the consecutive cycles with corresponding samples from a reference cycle to detect disturbances in said electromagnetic energy waveform, wherein the reference cycle is the cycle which immediately preceded the selected cycle, so that the reference cycle used changes as a different one of the consecutive cycles is selected for processing.

2. The waveform disturbance detection apparatus as claimed in claim 1, wherein the converter means further includes means for converting the plurality of samples into digital signals, and further wherein said processing means performs the comparison of samples by comparing the digital signals corresponding to the samples being compared, the processing means further including
    buffer means for storing a plurality of said corresponding digital signals from the reference cycle.

3. The waveform disturbance detection apparatus as claimed in claim 2, wherein in said processing means a disturbance is deemed to have occurred when the difference between a sample from the selected cycle and a corresponding sample from the reference cycle exceeds a predetermined tolerance range, the processing means further comprising
    disturbance counter means for counting the number of said disturbances.

4. The waveform disturbance detection apparatus as claimed in claim 3, wherein said disturbance counter means is re-initialized when the sample from the selected cycle is within said predetermined tolerance range.

5. The waveform disturbance detection apparatus as claimed in claim 2, 3 or 4, wherein said processing means replaces said corresponding digital signals contained in said buffer means with the digital signals corresponding to the samples of the selected cycle, so that the selected cycle becomes the reference cycle for the next cycle to be evaluated.

6. The waveform disturbance detection apparatus as claimed in claim 5, wherein said processing means further comprises
    post-disturbance buffer means for storing samples from at least one of said consecutive cycles that follows a selected cycle in which the number of disturbances exceed a predetermined limit of said disturbances.

7. The waveform disturbance detection apparatus as claimed in claim 6, further comprises
    recorder/display means for recording and displaying said disturbances.

8. The waveform disturbance detection apparatus as claimed in claim 2, 3 or 4, wherein said processing means replaces said corresponding digital signal contained in said buffer means with the digital signals corresponding to the samples of the selected cycle when said digital samples corresponding to the samples of the selected cycle are within said predetermined tolerance range.

9. The waveform disturbance detection apparatus as claimed in claim 8, wherein said processing means further comprises
    post-disturbance buffer means for storing samples from at least one of said consecutive cycles that follows a selected cycle in which the number of disturbances exceed a predetermined limit of said disturbances.

10. The waveform disturbance detection apparatus as claimed in claim 9, further comprises
    recorder/display means for recording and displaying said disturbances.

11. A waveform disturbance detection apparatus for detecting disturbances in alternating current electromagnetic energy waveform, said alternating current electromagnetic energy waveform having a plurality of periodic, substantially similar cycles, comprising
    attenuator means for attenuating said electromagnetic energy waveform, thereby generating an attenuated electromagnetic energy waveform;
    amplifier means for amplifying said attenuated electromagnetic energy waveform, thereby generating a modified electromagnetic energy waveform;
    analog to digital converter means for sampling said modified electromagnetic energy waveform, generating a plurality of samples, and converting said samples into digital signals; and
    processing means for evaluating said digital signals so as to detect disturbances in said electromagnetic energy waveform, wherein said processing means detects said disturbances by comparing a particular one of said digital signals that represents a particular one of said samples in a particular current one of said cycles with a corresponding one of said digital signals that represents a corresponding one of said samples from an immediately preceding one of said cycles, said processing means comprises
        buffer means for storing a plurality of said corresponding digital signals, wherein each of said corresponding digital signals is from said immediately preceding cycle, whereby said particular current digital signal is compared with said corresponding digital signal from said immediately preceding cycle; and
    disturbance counter means for counting the number of said disturbances, wherein said counter means is incremented when said particular digital signal representing said particular sample exceeds a predetermined tolerance range.

12. The waveform disturbance detection apparatus as claimed in claim 11, wherein said disturbance counter means is re-initialized when said particular digital signal is within said predetermined tolerance range.

13. The waveform disturbance detection apparatus as claimed in claim 11 or 12, wherein said processing means replaces said corresponding digital signal from said immediately preceding cycle contained in said buffer means with said particular current digital signal.

14. The waveform disturbance detection apparatus as claimed in claim 13, wherein said processing means further comprises
post-disturbance buffer means for storing said digital signals of at least one of said cycles that follows said particular current cycle in which the number of disturbances exceed a predetermined limit of said disturbances.

15. The waveform disturbance detection apparatus as claimed in claim 14, further comprises
recorder/display means for recording and displaying said disturbances.

16. The waveform disturbance detection apparatus as claimed in claim 11 or 12, wherein said processing means replaces said corresponding digital signal from said immediately preceding cycle contained in said buffer means with said particular current digital signal when said particular current digital signal is within said predetermined tolerance range.

17. The waveform disturbance detection apparatus as claimed in claim 16, wherein said processing means further comprises
post-disturbance buffer means for storing said digital signals of at least one of said consecutive cycles that follows said particular current cycle in which the number of disturbances exceed a predetermined limit of said disturbances.

18. The waveform disturbance detection apparatus as claimed in claim 17, further comprises
recorder/display means for recording and displaying said disturbances.

19. A method of detecting waveform disturbances in an alternating current electromagnetic energy waveform, said alternating current electromagnetic energy waveform having a plurality of periodic, substantially similar cycles, comprising
sampling said electromagnetic energy waveform to generate a plurality of samples;
converting said samples into digital signals;
storing said digital signals of at least a selected one of said cycles;
storing said digital signals of a particular one of said cycles which immediately precedes said selected one of said cycles;
comparing a particular one of said digital signals that represents a particular one of said samples in said selected cycle with a corresponding one of said digital signals that represents a corresponding one of said samples of the cycle which immediately preceded the selected cycle to detect a disturbance in said particular digital signal; and
counting said disturbance when said particular digital signal exceeds a predetermined tolerance range.

20. The method of detecting waveform disturbances as claimed in claim 19, further comprises
replacing said stored, corresponding digital signal with said particular digital signal.

21. The method of detecting waveform disturbances as claimed in claim 19 or 20, further comprising
restarting the counting of said disturbances from zero when said disturbances for said particular cycle is within a predetermined limit to permit recounting of future said disturbances in a future said particular cycle.

22. The method of detecting waveform disturbances as claimed in claim 21, further comprises
storing said digital signals of at least one of said cycles that follows said particular cycle in which the number of disturbances exceed a predetermined limit of said disturbances.

23. The method of detecting waveform disturbances as claimed in claim 22, further comprises
recording and displaying said disturbances.

24. The method of detecting waveform disturbances as claimed in claim 19, further comprises
replacing said stored, corresponding digital signal with said particular digital signal when said particular digital signal is within said predetermined tolerance range.

25. The method of detecting waveform disturbances as claimed in claim 24, further comprises
restarting the counting of said disturbances from zero when said disturbances for said particular cycle is within a predetermined limit to permit recounting of future said disturbances in a future said particular cycle.

26. The method of detecting waveform disturbances as claimed in claim 25, further comprises
storing said digital signals of at least one of said cycles that follows said particular cycle in which the number of disturbances exceed a predetermined limit of said disturbances.

27. The method of detecting waveform disturbances as claimed in claim 26, further comprises
recording and displaying said disturbances.

28. A method of detecting waveform disturbances in alternating current electromagnetic energy waveform, said alternating current electromagnetic energy waveform having a plurality of periodic, substantially similar cycles, comprising
attenuating said electromagnetic energy waveform to generate an attenuated electromagnetic energy waveform;
amplifying said attenuated electromagnetic energy waveform to generate a modified electromagnetic energy waveform;
sampling said modified electromagnetic energy waveform to generate a plurality of samples;
converting said samples into digital signals;
processing said digital signals to detect disturbances in said electromagnetic energy waveform, said processing step comprising the steps of
storing said digital signals of a particular, current one of said cycles;
storing said digital signals of a cycle which immediately precedes the current one of said cycles;
comparing a particular one of said digital signals that represents a particular one of said samples in said particular current cycle with a corresponding one of said digital signals that represents a corresponding one of said samples of said immediately preceding cycles to detect a disturbance on said alternating current electromagnetic energy waveform; and
counting said disturbance when it exceeds apredetermined tolerance range to obtain a count of the number of the disturbances in the particular current cycle.

29. The method of detecting waveform disturbances as claimed in claim 28, wherein said processing step further comprises
   replacing said stored, corresponding digital signal from said immediately preceding cycle with said particular digital signal from said particular current cycle.

30. The method of detecting waveform disturbances as claimed in claim 28 or 29, wherein said processing step further comprises
   restarting the counting of said disturbances when said count of said disturbances for said particular cycle is within a predetermined limit to permit recounting of future said disturbances in a future said particular cycle.

31. The method of detecting waveform disturbances as claimed in claim 30, wherein said processing step further comprises
   storing said digital signals of at least one of said cycles that follows a particular current cycle in which the count exceeds said predetermined limit of said disturbances.

32. The method of detecting waveform disturbances as claimed in claim 31, further comprises
   recording and displaying said disturbances.

33. The method of detecting waveform disturbances as claimed in claim 28, wherein said processing step further comprises
   replacing said stored preceding, corresponding digital signal from said immediately preceding cycle with said particular digital signal from said current cycle when said particular digital signal is within said predetermined tolerance range.

34. The method of detecting waveform disturbances as claimed in claim 33, wherein said processing step further comprises
   restarting the counting of said disturbances when said count of disturbances for said particular cycle is within a predetermined limit to permit recounting of future said disturbances in a future said particular cycle.

35. The method of detecting waveform disturbances as claimed in claim 34, wherein said processing step further comprises
   storing said digital signals of at least one of said cycles that follows said particular current cycle in which the count exceeded a predetermined limit of said disturbances.

36. The method of detecting waveform disturbances as claimed in claim 35, further comprises
   recording and displaying said disturbances.

37. A waveshape variance detection apparatus for detecting variances in the shape of a waveform, said waveform having a plurality of periodic, substantially similar cycles, comprising
   converter means for sampling said waveform, generating a plurality of samples, and converting said samples into digital signals; and
   processing means for evaluating said digital signals so as to detect said variances, wherein said processing means detects said variances by comparing a particular one of said digital signals that represents a particular one of said samples in a particular one of said cycles with a corresponding one of said digital signals that represents a corresponding one of said samples from an immediately preceding one of said cycles.

38. The waveshape variance detection apparatus as claimed in claim 37, wherein said processing means comprises
   buffer means for storing a plurality of said corresponding digital signals, wherein each of said corresponding digital signals is from said immediately preceding cycle, whereby said particular digital signal is compared with said corresponding digital signal.

39. The waveshape variance detection apparatus as claimed in claim 38, wherein said processing means further comprises
   variance counter means for counting the number of said variances, wherein said counter means is incremented when said particular digital signal representing said particular sample exceeds a predetermined tolerance range.

40. The waveshape variance detection apparatus as claimed in claim 39, wherein said variance counter means is re-initialized when said particular digital signal is within said predetermined tolerance range.

41. The waveshape variance detection apparatus as claimed in claim 38, 39 or 40, wherein said processing means replaces said corresponding digital signal contained in said buffer means with said particular digital signal.

42. The waveshape variance detection apparatus as claimed in claim 41, wherein said processing means further comprises
   post-variance buffer means for storing said digital signals of at least one of said cycles that follows said particular cycle in which the number of variances exceeds a predetermined limit of said variances.

43. The waveshape variance detection apparatus as claimed in claim 42, further comprises
   recorder/display means for recording and displaying said variances.

44. A method of detecting variances in the waveshape of a waveform, said waveform having a plurality of periodic, substantially similar cycles, comprising
   sampling said waveform to generate a plurality of samples;
   converting said samples into digital signals;
   storing said digital signals of a particular one of said cycles;
   storing said digital signals of the cycle which immediately precedes the particular one of said cycles;
   comparing a particular one of said digital signals that represents a particular one of said samples in said particular cycle with a corresponding one of said digital signals that represents a corresponding one of said samples of said immediately preceding cycle to detect a variance in said particular digital signal; and
   counting said variance when it exceeds a predetermfined tolerance range.

45. The method of detecting waveshape variances as claimed in claim 44, further comprises
   replacing said stored, corresponding digital signal from said immediately preceding cycle with said particular digital signal from said particular one of said cycles.

46. The method of detecting waveshape variances as claimed in claim 44 or 45, further comprises
   restarting the counting of said variances when the number of said variances for said particular cycle is within a predetermined limit to permit recounting of future said variances in a future said particular cycle.

47. The method of detecting waveshape variances as claimed in claim 46, further comprises
storing said digital signals of at least one of said cycles that follows said particular cycle in which the number of variances exceeded a predetermined limit of said variances.

48. The method of detecting waveshape variances as claimed in claim 47, further comprises
recording and displaying said variances.

49. A waveform disturbance detection apparatus for detecting disturbances in an alternating waveform having periodic, normally similar cycles, comprising
means for obtaining consecutive samples from a current cycle of the waveform;
means for storing consecutive reference samples from a reference cycle, wherein the reference cycle is the cycle which immediately preceded the current cycle of the waveform;
means for comparing each of the consecutive samples from the current cycle, as each consecutive sample is obtained, to a corresponding one of the reference samples stored in the storing means to detect whether a disturbance is present in the waveform; and
means for replacing each of the reference samples stored in the storing means with the corresponding sample from the current cycle against which it was compared, so that the reference samples in the storing means are updated each time a sample from the current cycle is evaluated.

* * * * *